(12) United States Patent
Tozer et al.

(10) Patent No.: US 7,969,727 B2
(45) Date of Patent: Jun. 28, 2011

(54) COOLING

(75) Inventors: Robert Tozer, Kingston upon Thames (GB); Cullen Bash, Los Gatos, CA (US); Chandrakant Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 189 days.

(21) Appl. No.: 12/432,199

(22) Filed: Apr. 29, 2009

(65) Prior Publication Data

US 2010/0277864 A1 Nov. 4, 2010

(51) Int. Cl.
*H05K 7/20* (2006.01)
*G06F 1/20* (2006.01)

(52) U.S. Cl. .......... 361/679.5; 361/679.53; 361/679.47; 361/679.48; 361/679.49; 361/690; 361/692; 361/694; 361/695

(58) Field of Classification Search ............. 361/679.53, 361/679.47, 679.48, 679.49, 679.5, 690, 361/692, 694, 695; 165/80.2
See application file for complete search history.

(56) References Cited

U.S. PATENT DOCUMENTS

| | | | | |
|---|---|---|---|---|
| 6,657,121 B2 * | 12/2003 | Garner | ........................ | 174/16.3 |
| 6,747,872 B1 * | 6/2004 | Patel et al. | ..................... | 361/695 |
| 6,804,117 B2 * | 10/2004 | Phillips et al. | ................ | 361/700 |
| 6,868,682 B2 * | 3/2005 | Sharma et al. | .................. | 62/180 |
| 7,209,351 B2 * | 4/2007 | Wei | ................................ | 361/695 |
| 7,385,810 B2 * | 6/2008 | Chu et al. | ................. | 361/679.48 |
| 7,500,911 B2 * | 3/2009 | Johnson et al. | ............... | 454/184 |
| 7,542,287 B2 * | 6/2009 | Lewis et al. | ................... | 361/695 |
| 7,643,291 B2 * | 1/2010 | Mallia et al. | .................. | 361/695 |
| 7,813,121 B2 * | 10/2010 | Bisson et al. | ............ | 361/679.51 |
| 2001/0029163 A1 * | 10/2001 | Spinazzola et al. | ........... | 454/184 |
| 2003/0053293 A1 * | 3/2003 | Beitelmal et al. | ............. | 361/687 |
| 2003/0067745 A1 * | 4/2003 | Patel et al. | ..................... | 361/690 |
| 2004/0037045 A1 * | 2/2004 | Phillips et al. | ................ | 361/719 |
| 2004/0065097 A1 * | 4/2004 | Bash et al. | ....................... | 62/180 |
| 2004/0090729 A1 * | 5/2004 | Beitelmal et al. | ............. | 361/103 |
| 2004/0100770 A1 * | 5/2004 | Chu et al. | ..................... | 361/698 |
| 2004/0217072 A1 * | 11/2004 | Bash et al. | ....................... | 211/26 |
| 2005/0168945 A1 * | 8/2005 | Coglitore | ...................... | 361/695 |
| 2005/0237716 A1 * | 10/2005 | Chu et al. | ..................... | 361/696 |
| 2005/0278069 A1 * | 12/2005 | Bash et al. | ..................... | 700/276 |
| 2006/0168975 A1 * | 8/2006 | Malone et al. | .................. | 62/180 |
| 2006/0199508 A1 * | 9/2006 | Nair et al. | ..................... | 454/237 |
| 2006/0232945 A1 * | 10/2006 | Chu et al. | ..................... | 361/724 |
| 2006/0250770 A1 * | 11/2006 | Campbell et al. | ............. | 361/695 |
| 2007/0213000 A1 | 9/2007 | Day | | |
| 2008/0055846 A1 * | 3/2008 | Clidaras et al. | ............... | 361/687 |
| 2008/0094799 A1 * | 4/2008 | Zieman et al. | ................ | 361/695 |
| 2008/0113603 A1 * | 5/2008 | Atallah | ......................... | 454/184 |
| 2008/0180903 A1 * | 7/2008 | Bisson et al. | ................. | 361/687 |

(Continued)

OTHER PUBLICATIONS

International Search Report and Written Opinion of PCT Application No. PCT/US2010/032824. Korean Intellectual Property Office. Dec. 14, 2010.

*Primary Examiner* — Anatoly Vortman

(57) ABSTRACT

According to one embodiment, an equipment enclosure includes a plurality of equipment elements, each element having one or more heat generating sources. A heat exchanger is mounted towards the top of the equipment enclosure. The heat exchanger is thermally coupled to at least some of the heat generating sources. The enclosure includes an exhaust vent through which air heated by the heat exchanger may be evacuated, and an inlet vent through which air from outside the equipment enclosure may be drawn into the equipment enclosure to cool the heat exchanger by stack effect ventilation.

13 Claims, 4 Drawing Sheets

U.S. PATENT DOCUMENTS

2008/0266794 A1* 10/2008 Malone .................. 361/695
2009/0009958 A1 1/2009 Pflueger
2009/0056910 A1* 3/2009 Mallia et al. .................. 165/80.3
2009/0059523 A1* 3/2009 Mallia et al. .................. 361/695

* cited by examiner

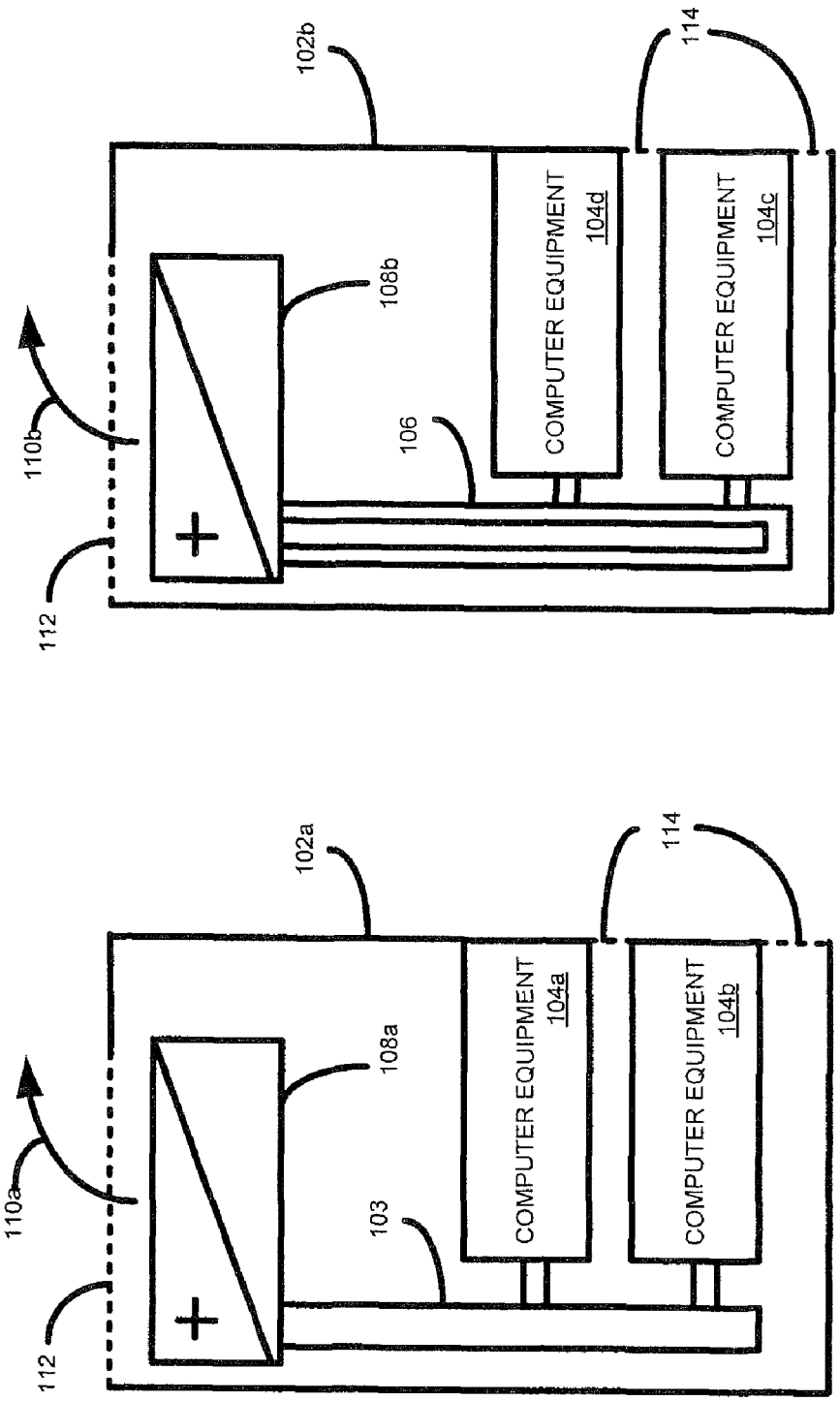

COOLING

BACKGROUND

For various economic and business reasons enterprises are increasingly centralizing their backend computer systems in purpose built data centers. Data centers typically house high concentrations and densities of such computer systems and additionally provide facilities such as uninterruptible power supplies and cooling systems necessary for the operation of the computer systems in the data center.

Computer systems inherently generate heat during operation. Typical heat generating sources in a computer system include central processing units (CPUs), graphics cards, mechanical storage drives, power supplies, and the like. This heat needs to be managed such that the maximum operating temperature of the various components of each computer system is not exceeded.

Individual computer systems, such as servers, typically use heat sinks to remove heat from heat generating sources. The heat is then evacuated outside the computer system housing by one or more internal mechanical fans which draw in cooler air from outside the computer system housing and exhaust warmed air through an exhaust vent. Typically computer systems are designed to draw air in through a vent on the front of the system and to exhaust warmed air through a vent in the rear of the system.

When arranged in data centers, computer equipment is generally installed in a frame or enclosure, such as a server enclosure rack, a rackable cabinet, or a server rack. Hereinafter structures suitable for housing computer equipment are referred to as equipment enclosures. An equipment enclosure may house multiple items of computer equipment. Generally the depth of the equipment enclosure is chosen to have the approximately the same depth as the computer equipment installed therein. The rear panels of equipment enclosures are generally either not present, or are perforated to enable suitable ventilation of the installed computer equipment. In this way, air from outside the equipment enclosure is drawn into the computer equipment through a computer equipment front inlet vent, and is exhausted out of the computer equipment through a computer equipment rear exhaust vent. In such an arrangement, outside air heated by the computer equipment does not enter the equipment enclosure.

Data centers also generally use computer room air conditioning units that supply cooled air to the front of the equipment enclosures and evacuate heated air from the back of the equipment enclosures to enhance cooling of the computer equipment.

Accordingly, a significant proportion of the operating cost of a data center can come arise from the operation of cooling systems, both within individual computer equipment and at the data center infrastructure level

BRIEF DESCRIPTION OF DRAWINGS

Embodiments of various systems and methods will now be described, by way of non-limiting example only, with reference to the accompanying drawings, in which:

FIG. 1a is a simplified section view of an equipment enclosure 102a according to one embodiment;

FIG. 1b is a simplified section view of an equipment enclosure 102b according to an embodiment;

DETAILED DESCRIPTION

Figure 3:
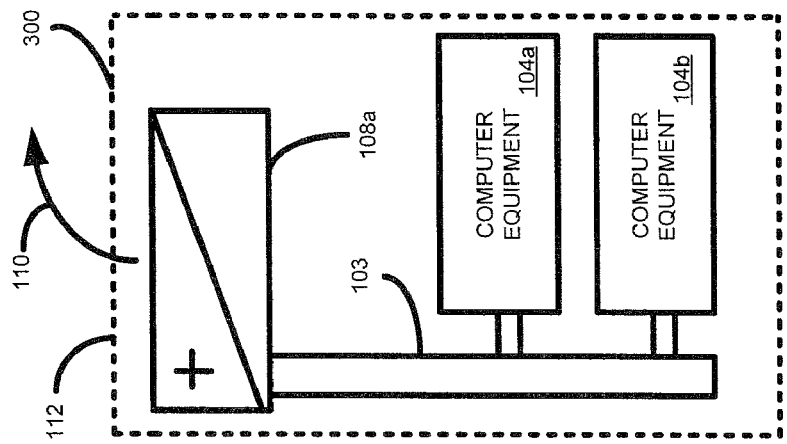
FIG. 3 is a simplified section view of an equipment enclosure 300 according to one embodiment.

Referring now to FIGS. 1a and 1b, there is shown a simplified section view of an equipment enclosure 102a according to a first embodiment, and an equipment enclosure 102b according to a second embodiment. The equipment enclosures 102a and 102b each comprise a substantially closed enclosure, with notably no exhaust vents in the rear of the equipment enclosure. The equipment enclosures also comprise a number of rails or other mounting means in which a number of a number of equipment enclosure-mountable computer equipment elements 104a, 104b, 104c, and 104d may be mounted or installed.

For simplicity only two pieces of computer equipment are shown per equipment enclosure, however those skilled in the art will appreciate that equipment enclosures may also contain many more pieces of computer equipment. The computer equipment may be, for example, computer servers, with each piece of equipment comprising one or more electronic heat generating sources, such as central processing units, graphics cards, DVD drives, power supplies, and the like.

In equipment enclosure 102a at least some of the heat generating sources of the computer equipment 104a and 104b are thermally coupled to a heat pipe 103. For example, heat generating sources may be thermally coupled directly to the heat pipe, or indirectly through separate heat pipes, thermosiphons, or in any other appropriate manner. The heat pipe 103 is additionally thermally coupled to a heat exchanger 108a housed within the equipment enclosure 102a.

In equipment enclosure 102b at least some of the heat generating sources of the computer equipment 104c and 104d are thermally coupled to a thermosiphon 106. For example, heat generating sources may be thermally coupled directly to the thermosiphon 106, or indirectly through separate heat pipes, thermosiphons, or in any other appropriate manner. The thermosiphon 106 is additionally thermally coupled to a heat exchanger 108b housed within the equipment enclosure 102b.

The heat pipe 103 and thermosiphon 106 transfer heat from the heat sources to which they are thermally coupled to their respective heat exchangers. This prevents a build up of excess heat in the computer equipment 104a, 104b, 104c, and 104d, enabling the computer equipment to operate within its predetermined temperature operation range.

In one embodiment, the heat exchangers 108a and 108b are suitable for being air cooled, such as a tubed and finned heat exchanger, or the like. The precise type and technical characteristics of the heat exchanger may be determined by taking into account various parameters including, for example, the maximum outside air temperature, maximum operating temperature of the computer equipment, density of computer equipment, and the altitude of the data center.

As the heat exchangers 108 heat up, as a result of being thermally coupled to one or more heat generating sources, the air 110a and 110b in contact with the heat exchangers rises and is exhausted through exhaust vents 112 located in the top of the equipment enclosure housings. This action draws in cooler air from outside the equipment enclosures through inlet vents 114 located in the front side of the equipment enclosure housing.

Adequate space is provided within the equipment enclosure to house the heat pipe and to enable sufficient air circulation from the inlet vents 114 to the exhaust vents 112 to cool the heat exchanger 108. For example, in the present embodiments space is left between the rear of the computer equipment and the rear of the equipment enclosure to enable the heat exchanger to be cooled by natural stack effect ventilation. In other embodiments alternative space arrangements may be used.

Due to the efficiency at which the heat pipes and thermosiphons remove heat from the heat generating sources, the computer equipment 104a, 104b, 104c, and 104d does not require the use of internal mechanical fans to cool the heat generating sources. This leads to improved energy savings and a consequent reduction in operating costs. Since no fans are needed, the computer equipment 104a, 104b, 104c, and 104d also do not require traditional inlet and outlet vents, since the heat is effectively removed by the heat pipe 103 or thermosiphon 106. In this case, outside air drawn in through inlet vents 114 does not need to circulate within the computer equipment 104a and 104b, enabling the computer equipment housings to be substantially closed to the outside air.

Figure 2B:
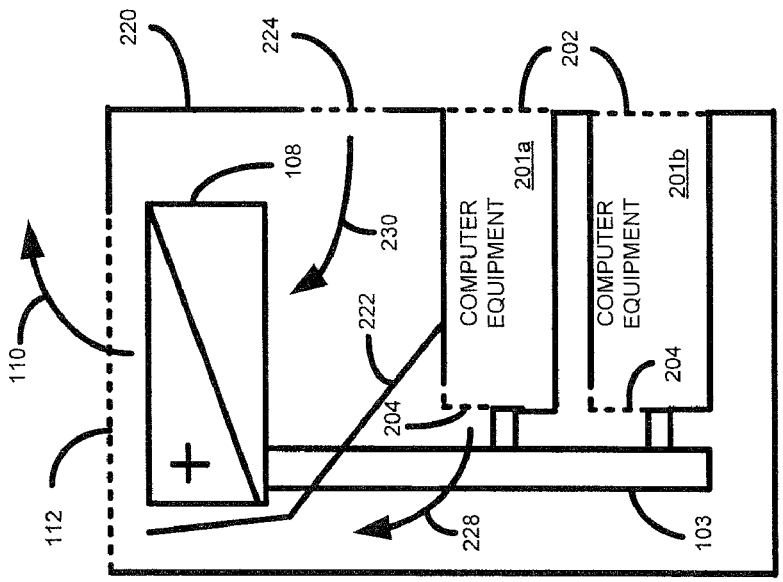
FIG. 2b is a simplified section view of an equipment enclosure 220 according to an embodiment.
Figure 2A:
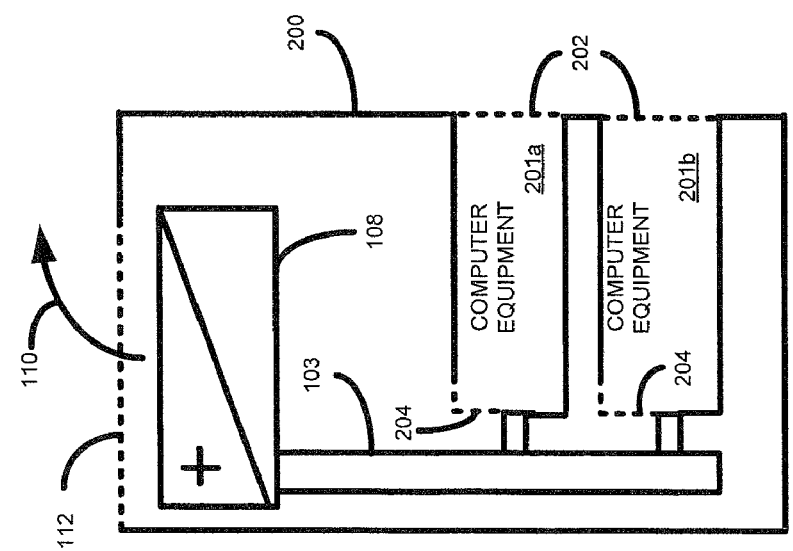
FIG. 2a is a simplified section view of an equipment enclosure 200 according to another embodiment.

FIG. 2a shows an equipment enclosure 200 arrangement according to a further embodiment. Like references with FIG. 1 indicate like elements. The equipment enclosure 200 houses computer equipment 201a and 201b each having an inlet vent 202 located at the front of the computer equipment, and an exhaust vent 204 located at the rear of the computer equipment.

In one embodiment, the equipment enclosure 200 is arranged such that outside air may only be drawn into the equipment enclosure 200 through the inlet vents 202 and the outlet vents 204 of the computer equipment 201a and 201b. This may be achieved, for example, by using blanking plates or brushes on any empty equipment enclosure placements, or by mounting the computer equipment in such a way that substantially no space is left vertically between different computer equipment elements. In this way, the stack effect ventilation responsible for cooling the heat exchanger 108 additionally helps remove any residual heat in the computer equipment 201a and 201b not removed by the heat pipe 103. In this embodiment a single air path is used for cooling both the computer equipment 201 and the heat exchanger 108.

FIG. 2b shows an additional embodiment similar to that shown in FIG. 2a. The equipment enclosure 220 has an additional inlet vent 224 through which outside air is drawn, by stack effect ventilation, to directly cool the heat exchanger 108. The equipment enclosure also has an internal baffle 222 which segregates the air drawn in through inlet vent 224 from the air drawn in through inlet vents 202 in the computer equipment 201a and 201b. In this way two separate and parallel air paths are established. The first path cools the heat exchanger directly using outside air, the second path directly cools the computer equipment, again using stack effect ventilation, using outside air. The heated exhaust air in both paths is evacuated through the exhaust vent 112.

These embodiments may provide improvements since not all heat generating components within the computer equipment 201 need be thermally coupled to the heat pipe 103. For example, components generating only a small to moderate amount of heat may be suitable cooled by stack effect ventilation.

FIG. 3 shows equipment enclosure 300 arrangement according to a further embodiment. The equipment enclosure 300 is substantially open to the air outside of the equipment enclosure, for example through use of an open structured equipment enclosure, an equipment enclosure having substantially perforated housing members, or in any suitable manner. In this way, stack effect ventilation as a result of the heat exchanger 108a being heated is maximized.

In the present embodiments, stack effect ventilation is made possible by concentrating the heat generated by the different computer equipment in each equipment enclosure in a single equipment enclosure-located heat exchanger.

Figure 4:
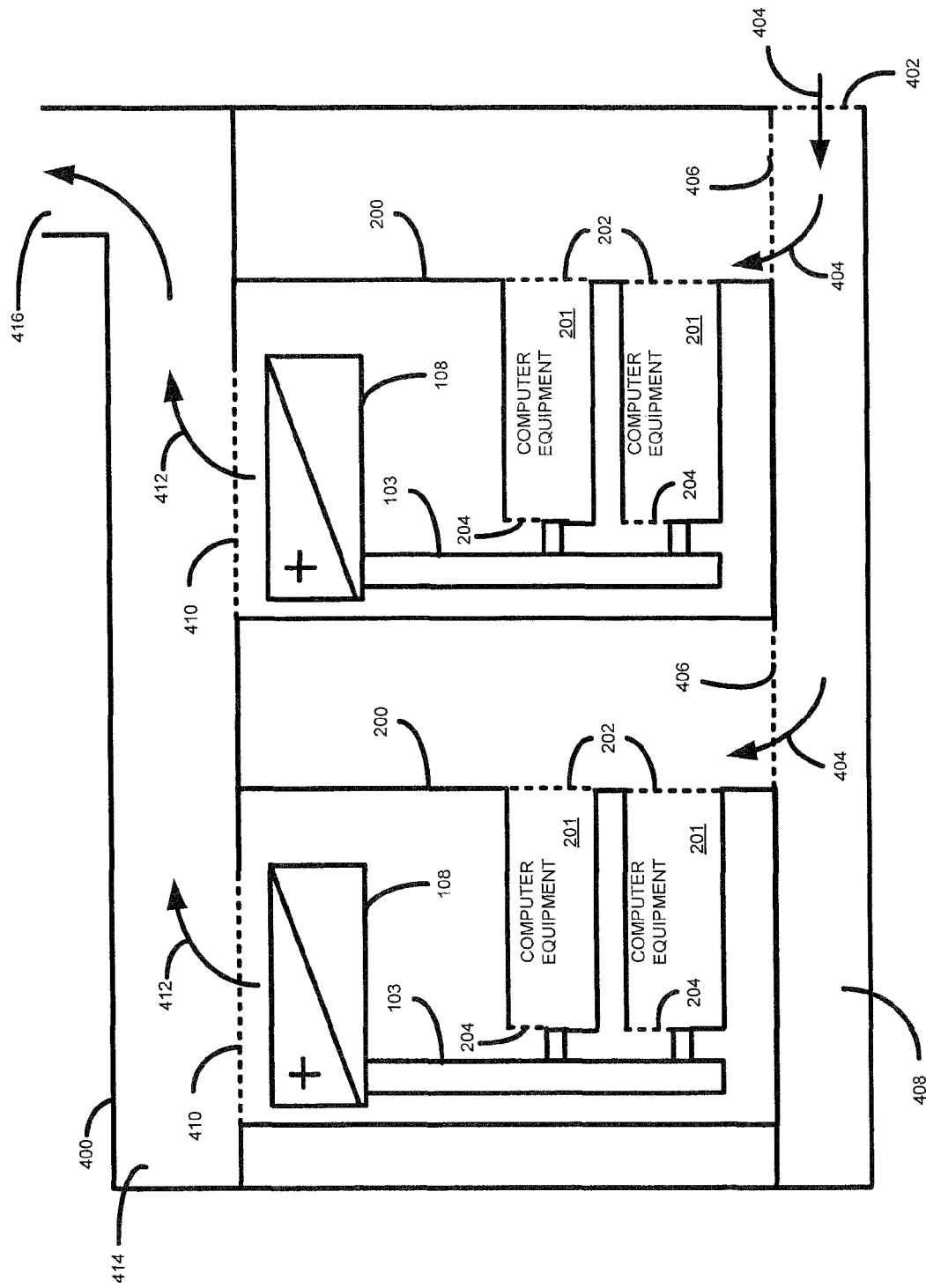
FIG. 4 is a simplified section view of a data center 400 according to an embodiment.

FIG. 4 shows a simplified section view of a data center 400 according to another embodiment.

The data center 400 includes a number of rows of equipment enclosures, such as the equipment enclosures 200, each housing computer equipment 201. The data center may be, for example, a purpose built 'bricks and mortar' data center, or a containerized data center such as a portable on-demand (POD) data center. In further embodiments, the data center may be populated with other types or combinations of equipment enclosures such as, for example, those previously described herein.

In one embodiment, the data center 400 includes a cold air plenum 408 through which outside air 404 may enter through inlet vent 402. The data center 400 also includes a hot air ceiling void 414 through which heated air may be exhausted outside of the data center 400 through an exhaust vent 416. The ceiling void 414 additionally has vents 410 arranged in fluid communication with the exhaust vents 112 of the equipment enclosures 200, thereby allowing air heated by the heat exchangers 108 within each equipment enclosure to be evacuated outside of the data center 400. As previously described, stack effect ventilation created by the exhausting of air 412 heated by the heat exchangers causes cooler outside air 404 to be drawn into the data center 400 and into the equipment enclosures 200, thereby cooling the heat exchangers 108 and hence the computer equipment 201.

Figure 5:
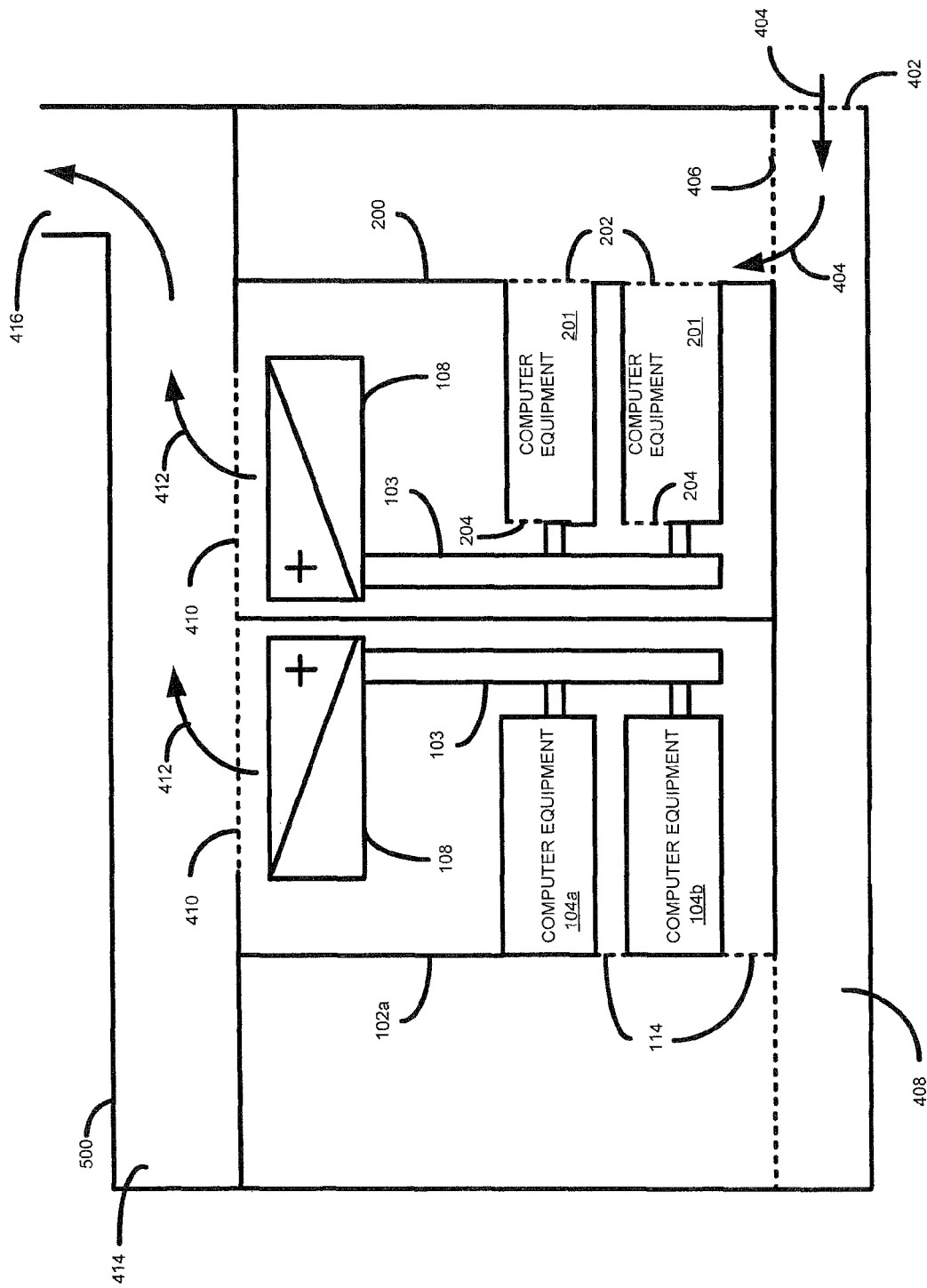
FIG. 5 is a simplified section view of a data center 500 according to an embodiment.

FIG. 5 shows a simplified section view of a data center 500 according to yet further embodiment. Like elements with FIG. 4 are shown having like references.

The data center 500, for example, includes a number of rows of equipment enclosures, such as the equipment enclosures 102a and 200, each housing computer equipment. Since the equipment enclosures 102a and 200 do not have rear exhaust vents, it is possible to arrange the equipment enclosures in a back-to-back manner whereby no or little space is left between the rear panels of opposing equipment enclosures. Arranging the equipment enclosures in this manner may improve the data center since it enables a higher density of equipment enclosures, and hence a higher density of computer equipment, to be housed within the data center 500. Such an arrangement does away with the need to have a hot aisle between the rear panels of rows of opposing equipment enclosures, in one embodiment.

In some embodiments, a data center can be improved in that they do not require an external supply of cooled air or water. In this way, the data centers according to some embodiments are substantially self-contained, requiring, at a bare minimum only external power and computer network connections. This allows such containerized data centers, for example, to be deployed in diverse locations without requiring an extensive existing infrastructure.

Due to the efficiency of heat pipes and thermosiphons at removing heat directly from the heat sources in one or more embodiments, the computer equipment elements do not require the use of internal mechanical fans to cool the heat sources. Furthermore, cooling of the computer equipment by stack effect ventilation removes the requirement for mechanical cooling elements, such as fans, computer room air conditioning units, and the like, leading to even greater potential energy savings.

If, however, stack effect ventilation is insufficient to provide adequate cooling, further embodiments provide supplemental cooling elements. This may be the case, for example, when the outside ambient conditions are unsuitable.

For example, in further embodiments, a mechanical fan may be arranged to provide forced cooling of the heat exchanger within each equipment enclosure when required. A fan may, for example, be mounted within the equipment enclosure, above the equipment enclosure, or in any other suitable location.

Within a data center, supplementary cooling elements may also be added to cool or chill the outside air using, for example, cooling coils, adiabatic coolers, computer room air conditioning units, and the like.

Although the embodiments described herein use thermosiphons or heat pipes, those skilled in the art will appreciate that other suitable heat transfer elements or conductors may be used. Such as, for example, a pumped liquid loop or mechanical refrigeration loop.

Although the embodiments described herein refer primarily to computer equipment having one or more heat generating sources, those skilled in the art will appreciate that the present embodiments are in no way limited thereto. For example, the computer equipment described herein may be substituted by any suitable equipment element having one or more heat generating sources. Such equipment elements may include, for example, other electronic or mechanical equipment, such as power supplies, transformers, pumps, lighting equipment and the like. Furthermore, those skilled in the art will further appreciate that reference made herein to data centers is not limited thereto, and could encompass other facilities housing one or more equipment elements.

The invention claimed is:

1. An equipment enclosure, comprising:
   a plurality of equipment elements, each element having one or more heat generating sources, and the equipment elements have inlet and exhaust vents located in their housings;
   a heat exchanger mounted towards the top of the equipment enclosure, the heat exchanger being thermally coupled to at least some of the heat generating sources;
   an exhaust vent in the top of the equipment enclosure through which air heated by the heat exchanger may be evacuated;
   an inlet vent through which air from outside the equipment enclosure may be drawn into the equipment enclosure to cool the heat exchanger by stack effect ventilation; and
   a baffle to segregate outside air drawn in through the equipment elements from outside air drawn through the equipment enclosure inlet vent.

2. An equipment enclosure as claimed in claim 1, wherein the heat exchanger is thermally coupled to the one or more heat generating sources by at least one of: a heat pipe; or a thermosiphon.

3. An equipment rack as claimed in claim 1, arranged to provide an air space between the back of the equipment elements and the back of the equipment enclosure to allow stack effect ventilation of the heat exchanger.

4. An equipment enclosure as claimed in claim 1, the equipment enclosure having a substantially closed housing.

5. An equipment enclosure as claimed in claim 4, the equipment elements having substantially closed housings, the equipment enclosure further comprising inlet and exhaust vents located in the equipment enclosure housing.

6. An equipment enclosure as claimed in claim 1, the equipment enclosure having a housing substantially open to the outside air.

7. An equipment enclosure as claimed in claim 1, further comprising at least one of: a mechanical cooling element; or a mechanical ventilation element.

8. A facility comprising:
   one or more equipment enclosures, where an equipment enclosure comprises:
      a plurality of equipment elements, each element having one or more heat generating sources, and the equipment elements have inlet and exhaust vents located in their housings;
      a heat exchanger mounted towards the top of the equipment enclosure, the heat exchanger being thermally coupled to at least some of the heat generating sources;
      an exhaust vent in the top of the equipment enclosure through which air heated by the heat exchanger may be evacuated;
      an inlet vent through which air from outside the equipment enclosure may be drawn into the equipment enclosure to cool the heat exchanger by stack effect ventilation; and
      a baffle to segregate outside air drawn in through the equipment elements from outside air drawn through the equipment enclosure inlet vent.

9. The facility as claimed in claim 8, further comprising:
   a cold air plenum for providing air outside of the facility to the equipment enclosures; and
   a ceiling void for evacuating heated air to outside of the facility, the exhaust vents of the one or more equipment enclosures being arranged in fluid communication with the ceiling void.

10. The facility of claim 8, further comprising a mechanical cooling element to mechanically cool air drawn in from outside of the facility.

11. The facility of claim 8, further comprising a mechanical ventilation element to forcibly draw in air from outside of the facility.

12. The facility of claim 8, wherein the equipment enclosures are arranged back-to-back.

13. A data center comprising:
   a plurality of equipment enclosures, each equipment enclosure comprising:
      a plurality of equipment elements, each element having one or more heat generating sources, and the equipment elements have inlet and exhaust vents located in their housings;
      a heat exchanger mounted towards the top of the equipment enclosure, the heat exchanger being thermally coupled to at least some of the heat generating sources;
      an exhaust vent in the top of the equipment enclosure through which air heated by the heat exchanger may be evacuated;
      an inlet vent through which air from outside the equipment enclosure may be drawn into the equipment enclosure to cool the heat exchanger by stack effect ventilation; and
      a baffle to segregate outside air drawn in through the equipment elements from outside air drawn through the equipment enclosure inlet vent;
   the data center further comprising:
   a cold air plenum for providing air outside of the facility to the equipment enclosures; and
   a ceiling void for evacuating heated air to outside of the facility, the exhaust vents of the one or more equipment enclosures being arranged in fluid communication with the ceiling void.

* * * * *